(12) United States Patent
Bang et al.

(10) Patent No.: US 7,803,506 B2
(45) Date of Patent: Sep. 28, 2010

(54) METHODS OF MEASURING CRITICAL DIMENSIONS AND RELATED DEVICES

(75) Inventors: Kyoung-Yoon Bang, Gyeonggi-do (KR);
Hae-Young Jeong, Gyeonggi-do (KR);
Yong-Hoon Kim, Gyeonggi-do (KR);
Yo-Han Choi, Gyeonggi-do (KR);
Hyung-Joo Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 686 days.

(21) Appl. No.: 11/811,979

(22) Filed: Jun. 13, 2007

(65) Prior Publication Data
US 2007/0292778 A1      Dec. 20, 2007

(30) Foreign Application Priority Data
Jun. 15, 2006     (KR) ...................... 10-2006-0053842

(51) Int. Cl.
*G03F 9/00*     (2006.01)
*G01B 11/08*    (2006.01)

(52) U.S. Cl. ......................... 430/30; 356/636; 382/145; 438/16

(58) Field of Classification Search ................... 430/30; 356/636; 382/145; 438/16
See application file for complete search history.

(56) References Cited

U.S. PATENT DOCUMENTS

| | | |
|---|---|---|
| 6,252,670 B1 | 6/2001 | Sheng et al. |
| 6,476,920 B1 | 11/2002 | Scheiner et al. |
| 6,773,939 B1 | 8/2004 | Wright |

FOREIGN PATENT DOCUMENTS

KR     1020050068011     7/2005

*Primary Examiner*—Christopher G Young
(74) *Attorney, Agent, or Firm*—Myers Bigel Sibley & Sajovec, P.A.

(57) ABSTRACT

A method of measuring a critical dimension may include forming an object pattern on a substrate and forming a plurality of reference patterns on the substrate, wherein each of the plurality of reference patterns has a different critical dimension. An optical property of each of the plurality of reference patterns may be measured to provide a respective measured optical property for each of the reference patterns, and an optical property of the object pattern may be measured to provide a measured optical property of the object pattern. The measured optical property of the object pattern may be compared with the measured optical properties of the reference patterns, and a critical dimension of the object pattern may be determined as being the same as the critical dimension of the reference pattern having the measured optical property that is closest to the measured optical property of the object pattern. Related devices are also discussed.

12 Claims, 4 Drawing Sheets

METHODS OF MEASURING CRITICAL DIMENSIONS AND RELATED DEVICES

RELATED APPLICATION

This application claims the benefit of priority under 35 U.S.C. §119 to Korean Patent Application No. 2006-53842 filed on Jun. 15, 2006, the disclosure of which is hereby incorporated herein by reference in its entirety.

FIELD OF THE INVENTION

The present invention relates to microelectronics fabrication, and more particularly to methods of measuring critical dimensions and related devices.

BACKGROUND

Generally, a photolithography process used to manufacture a semiconductor device includes forming a photoresist pattern on a semiconductor substrate. The photolithography process may include a coating step, a baking step, an exposure step, and a development step. The coating step is used to form a photoresist film on the semiconductor substrate, and the baking step is used to harden the photoresist film. The exposure step and the development step are used to transform the photoresist film into a photoresist pattern using a reticle.

The photoresist film on the semiconductor substrate is selectively exposed to light during the exposure process. More particularly, an image of a pattern on a mask is projected on the photoresist film using light from a light source to form the photoresist pattern. If the pattern on the mask is not uniform or the photoresist pattern on the semiconductor substrate is not sufficiently uniform, however, a reliability of the semiconductor device may be reduced. Accordingly, a uniformity of the photoresist patterns may need to be measured using critical dimensions.

Devices used to measure critical dimensions include scatterometers and/or scanning electron microscopes (SEM). A scatterometer uses a diffraction phenomenon generated when projected light is reflected on a material. A scatterometer may measure a critical dimension of a pattern having a bar shape. An SEM may measure critical dimensions of patterns having various shapes because an SEM uses real images of the patterns. Measuring critical dimensions from a mask and/or an entire semiconductor substrate, however, may take a relatively long time.

To measure critical dimensions of photoresist patterns, optic modeling may be used together with a spectrophotometer. If reflectivity or transmittance of photoresist patterns measured by the spectrophotometer is substantially identical to reflectivity or transmittance calculated from simulations, a simulated critical dimension of the photoresist pattern may be set as a critical dimension of the pattern of the mask or the photoresist pattern on the semiconductor substrate. Performing optic modeling, however, may take a long time because the simulations may need to be performed repeatedly.

SUMMARY

According to some embodiments of the present invention, a method of measuring a critical dimension may include forming an object pattern on a substrate, and forming a plurality of reference patterns on the substrate wherein each of the plurality of reference patterns has a different critical dimension. An optical property of each of the plurality of reference patterns may be measured to provide a respective measured optical property for each of the reference patterns, and an optical property of the object pattern may be measured to provide a measured optical property of the object pattern. The measured optical property of the object pattern may be compared with the measured optical properties of the reference patterns. A critical dimension of the object pattern may be determined as being the same as the critical dimension of the reference pattern having the measured optical property that is closest to the measured optical property of the object pattern.

Forming the plurality of reference patterns may include forming a plurality of preliminary reference patterns with each of the plurality of preliminary reference patterns having a different critical dimension, and measuring a critical dimension of each of the plurality of preliminary reference patterns to provide a respective measured critical dimension for each of the preliminary reference patterns. The measured critical dimensions of the respective preliminary reference patterns may be compared with intended critical dimensions of the respective preliminary reference patterns, and if the measured critical dimensions are substantially the same as the intended critical dimensions, the plurality of preliminary reference patterns may be maintained as the plurality of reference patterns. If the measured critical dimensions are substantially different than the intended critical dimensions, the first plurality of preliminary reference patterns may be removed, and a second plurality of preliminary reference patterns may be formed. Moreover, measuring a critical dimension of each of the plurality of preliminary reference patterns may include obtaining an image of each of the plurality of preliminary reference patterns using a scanning electron microscope.

In addition, an indication of the critical dimension of the object pattern may be provided on a display. Moreover, measuring an optical property of each of the plurality of reference patterns and measuring an optical property of the object pattern may include measuring the optical properties using a spectrophotometer. Measuring the optical property of the object pattern may include measuring the optical property over a region of the object pattern having a defined area, and measuring the optical properties of each of the reference patterns may include measuring the optical property over a respective region of each of the reference patterns having the defined area.

A first one of the reference patterns may have a first critical dimension less than the critical dimension of the object pattern, and a second one of the reference patterns may have a second critical dimension greater than the critical dimension of the object pattern. More particularly, a first one of the reference patterns may have a first critical dimension, a second one of the reference patterns may have a second critical dimension, and a third one of the reference patterns may have a third critical dimension. The second critical dimension may greater than the first critical dimension, the third critical dimension may be greater than the second critical dimension, and a difference between the first and second critical dimensions may be approximately the same as a difference between the second and third critical dimensions.

Measuring the optical property of each of the plurality of reference patterns may include measuring a reflectivity of each of the plurality of reference patterns, and measuring the optical property of the object pattern may include measuring a reflectivity of the object pattern. In an alternative, measuring the optical property of each of the plurality of reference patterns may include measuring a transmittance of each of the plurality of reference patterns, and measuring the optical property of the object pattern may include measuring a transmittance of the object pattern. Moreover, the substrate may include a semiconductor substrate or a photolithography mask substrate.

According to other embodiments of the present invention, a device may be provided to measure a critical dimension of an object pattern on a substrate wherein the substrate includes a plurality of reference patterns thereon with each of the plurality of reference patterns having a different critical dimension. More particularly, the device may include an acquiring unit, a comparing unit, and a setting unit. The acquiring unit may be configured to measure an optical property of each of the plurality of reference patterns to provide a respective measured optical property for each of the reference patterns. The acquiring unit may also be configured to measure an optical property of the object pattern to provide a measured optical property of the object pattern. The first comparing unit may be configured to compare the measured optical property of the object pattern with the measured optical properties of the reference patterns. The first setting unit may be configured to determine a critical dimension of the object pattern as being the same as the critical dimension of the reference pattern having the measured optical property that is closest to the measured optical property of the object pattern. In addition, the device may include a measuring unit, a second comparing unit, a second setting unit further. The measuring unit may be configured to measure a critical dimension of each of a plurality of preliminary reference patterns formed on the object wherein each of the plurality of preliminary reference patterns has a different critical dimension. The second comparing unit may be configured to compare the measured critical dimensions of the respective preliminary reference patterns with intended critical dimensions of the respective preliminary reference patterns. The second setting unit may be configured to maintain the plurality of the preliminary reference pattern as the plurality of the reference pattern when the measured critical dimensions of the respective preliminary reference patterns and the intended critical dimensions of the respective preliminary reference patterns are substantially identical. Moreover, the measuring unit may be a scanning electron microscope.

In addition, a display unit may be configured to provide an indication of the critical dimension of the object pattern. Moreover, the acquiring unit may include a spectrophotometer configured to measure the optical property of each of the plurality of reference patterns and to measure the optical property of the object pattern. For example, the acquiring unit may be configured to measure a reflectivity of each of the plurality of reference patterns and to measure a reflectivity of the object pattern, and/or the acquiring unit may be configured to measure a transmittance of each of the plurality of reference patterns and to measure a transmittance of the object pattern.

Some embodiments of the present invention may provide a method of measuring critical dimensions of patterns formed on substrates. Some other embodiments of the present invention may provide an apparatus used to measure critical dimensions.

According to some embodiments of the present invention, methods of measuring critical dimensions of an object pattern may include forming reference patterns having different reference critical dimensions on an object where an object pattern having a critical dimension is formed. Reference optic properties are acquired in accordance with the reference critical dimensions of the reference patterns. Accordingly, an optic property of the object pattern may be acquired and the optic property of the object pattern may be compared with the reference optic properties. One of the reference critical dimensions having the reference optic property substantially identical to the optic property of the object pattern may be set as the critical dimension of the object pattern.

According to some embodiments of the present invention, when forming the reference patterns, preliminary reference patterns having different critical dimensions may be formed on the object. The critical dimensions of the respective preliminary reference patterns may be measured and compared with the intended critical dimensions of the respective preliminary reference patterns. The preliminary reference pattern may be set as the reference pattern when the measured critical dimensions are substantially identical to the intended critical dimensions. On the other hand, the preliminary reference pattern may be formed again when the measured critical dimensions are not substantially identical to the reference critical dimensions.

The critical dimension of the object pattern may be displayed. The optic property of the object pattern may be acquired from a region of the object pattern having a same size as a region of the reference pattern. The reference critical dimensions of the reference patterns may include the reference critical dimension, which may be substantially the same as the critical dimension of the object pattern, and the reference critical dimension, which may be smaller or larger than the critical dimension of the object pattern. The optic property may be reflectivity and/or transmittance of the object patterns. The object may be a mask substrate or a semiconductor substrate.

According to some other embodiments of the present invention, an apparatus used to measure a critical dimension of an object pattern may include an acquiring unit, a first comparing unit and a first setting unit. The acquiring unit may acquire reference optic properties of reference patterns having different critical dimensions and an optic property of an object pattern having a critical dimension. The reference patterns and the object pattern may be formed on an object. The first comparing unit may compare the optic property of the object pattern with the reference optic properties. The first setting unit may set one of the reference critical dimensions having the reference optic property substantially identical to the optic property of the object pattern as the critical dimension of the object pattern.

The apparatus may further include a measuring unit, a second comparing unit and a second setting unit. The measuring unit may measure critical dimensions of preliminary reference patterns formed on the object. The critical dimensions may be different from one another. The second comparing unit may compare measured critical dimensions with reference critical dimensions. The second setting unit may set the preliminary reference pattern as the reference pattern when the measured critical dimensions are substantially identical to the reference critical dimensions. The measuring unit may be a scanning electron microscope (SEM).

The apparatus may further include a displaying unit displaying the critical dimension of the object pattern set by the first setting unit. The acquiring unit may be a spectrophotometer.

According to still other embodiments of the present invention, reference patterns having different critical dimensions may be formed on a side portion of a substrate having a central portion where patterns are formed. A reference optic property of the reference pattern may be compared with an optic property of the object pattern to measure critical dimensions of the object patterns. Therefore, the critical dimensions of the entire pattern may be measured relatively rapidly and accurately.

DETAILED DESCRIPTION

The present invention is described more fully hereinafter with reference to the accompanying drawings, in which embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
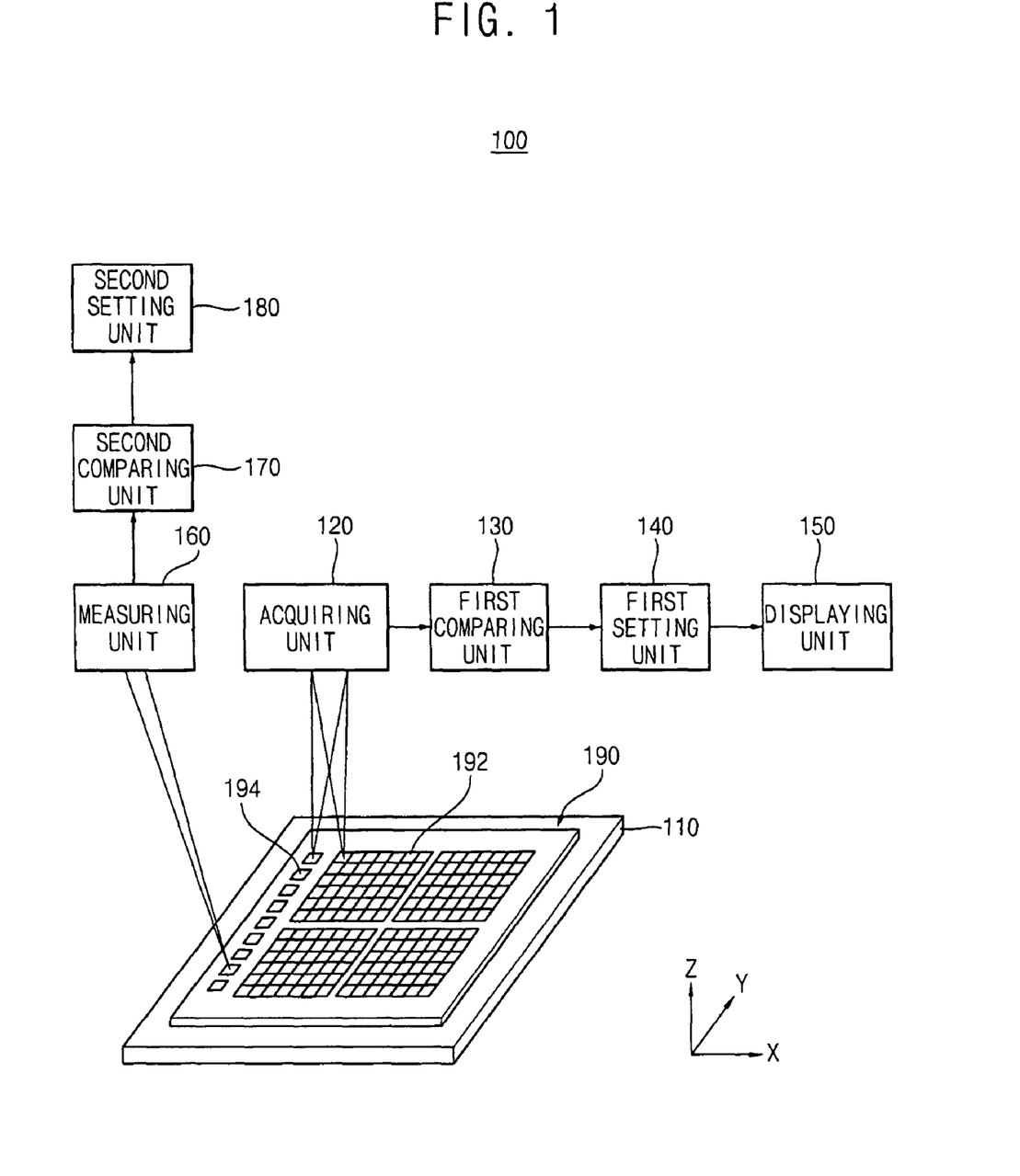
FIG. 1 is a block diagram illustrating an apparatus used to measure critical dimensions of an object pattern in accordance with some embodiments of the present invention.

FIG. 1 is a block diagram illustrating an apparatus used to measure a critical dimension (CD) of an object pattern in accordance with some embodiments of the present invention.

Referring to FIG. 1, an apparatus 100 used to measure a critical dimension of an object pattern may include a stage 110, an acquiring unit 120 (also referred to as an acquiring part), a first comparing unit 130 (also referred to as a first comparing part), a first setting unit 140 (also referred to as a first setting part), a displaying unit 150 (also referred to as a displaying part), a measuring unit 160 (also referred to as a measuring part), a second comparing unit 170 (also referred to as a second comparing part), and a second setting unit 180 (also referred to as a second setting part). The stage 110 supports a substrate 190, and the stage 110 may move along an X direction and/or a Y direction. The stage 110 may also move along a Z direction.

An object pattern 192 (from which a critical dimension or CD is to be measured) may be formed on a central portion of the substrate 190. A reference pattern 194 (used to measure the critical dimension of the object pattern 192) may be formed on a side or peripheral portion of the substrate 190. The reference patterns 194 may have different reference critical dimensions. More particularly, the reference critical dimensions may include a reference critical dimension substantially the same as a critical dimension of the object pattern 192, and at least one reference critical dimension smaller and/or larger than a critical dimension of the object pattern 192. The reference patterns 194 may be formed in regions having substantially the same size. The substrate 190 may be a transparent photolithography mask substrate, a semiconductor substrate, etc.

The acquiring unit 120 may acquire an optic property of the object pattern 192 and a reference optic property of the reference pattern 194. The reference optic property may be acquired from each reference critical dimension. The optic property may be acquired from a region of the object pattern 192 having substantially the same size as each region of the reference pattern 194. A position of the region of the object pattern 192 from which the optic property is acquired may vary. The optic property may include reflectivity, transmittance, etc.

The acquiring unit 120 may include a light source, a prism and/or a diffracting grating, and a detector. The light source projects light on pattern 192 and on reference pattern 194. The prism and/or the diffracting grating divides the light into monochromatic lights. The detector may detect light that is reflected from the object pattern 192 and from the reference pattern 194 or light that penetrates the object pattern 192 and the reference pattern 194. Further, the detector may acquire optic properties of the object pattern 192 and the reference pattern 194 using the detected light. The acquiring unit 120 may be a spectrophotometer, etc.

The first comparing unit 130 may compare the optic property of the region of the object pattern 192 (acquired by the acquiring unit 120) with the reference optic property of the reference critical dimension of the reference pattern 194.

The first setting unit 140 sets a critical dimension of the object pattern 192 according to a compared result obtained from the first comparing unit 130. If the optic property of the region of the object pattern 192 is substantially identical to one of the reference optic properties, the first setting unit 140 sets the critical dimension of the region of the object pattern 192 to the reference critical dimension according to the reference optic property.

The displaying unit 150 displays the critical dimensions of the regions of the object pattern 192. Thus, the critical dimensions of the entire pattern 192 may be clearly shown. The displaying unit 150 may be a monitor, etc.

The measuring unit 160, the second comparing unit 170 and the second setting unit 180 may verify whether or not the reference pattern 194 formed on the substrate 190 has the reference critical dimension.

The measuring unit 160 measures critical dimensions of preliminary reference patterns formed on the substrate 190 such that the preliminary reference patterns have the reference critical dimensions. The measuring unit 160 measures the critical dimensions using images of the preliminary reference patterns.

The measuring unit 160 may be a scanning electron microscope or other imaging device. A scanning electron microscope may include an electron gun, a magnetic lens, an axis-adjusting coil, a scanning coil, a diaphragm, a detector, etc. The scanning electron microscope may effectively measure critical dimensions of patterns having various shapes, such as critical dimensions of substantially bar shaped patterns.

The second comparing unit 170 compares the measured critical dimensions with intended critical dimensions of the respective preliminary reference patterns. The intended critical dimension(s) of the respective preliminary reference patterns may be the reference critical dimension(s). The second setting unit 180 sets the preliminary reference pattern as the reference pattern based on compared results obtained from the second comparing unit 170. If all measured critical dimensions are substantially identical to all intended critical dimensions, the second setting unit 180 may set the preliminary reference pattern as the reference pattern 194. If one of the measured critical dimensions is not substantially identical to any of the intended critical dimensions, the preliminary reference pattern may not be set as the reference pattern 194. Thus, the preliminary reference pattern may need to be removed and formed once again.

The above described apparatus 100 used to measure a critical dimension of an object pattern may measure the critical dimension of the object pattern 192 using the optic property of the object pattern 192 and the reference optic property of the reference pattern 194. Thus, a time required to measure the critical dimension of the object pattern 192 may be reduced.

Figure 2:
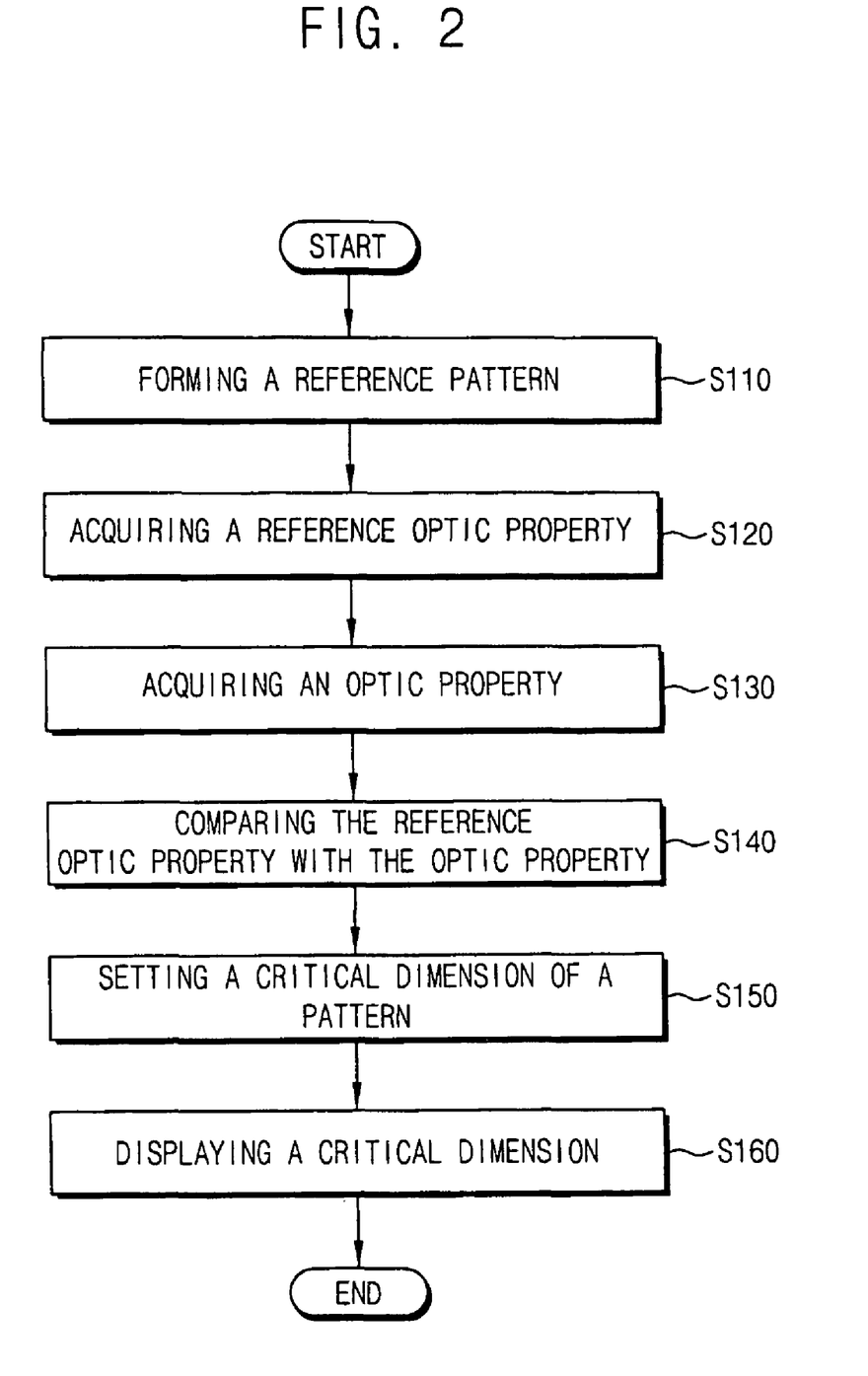
FIG. 2 is a flow chart illustrating methods of measuring critical dimensions of patterns in accordance with some embodiments of the present invention.
Figure 3:
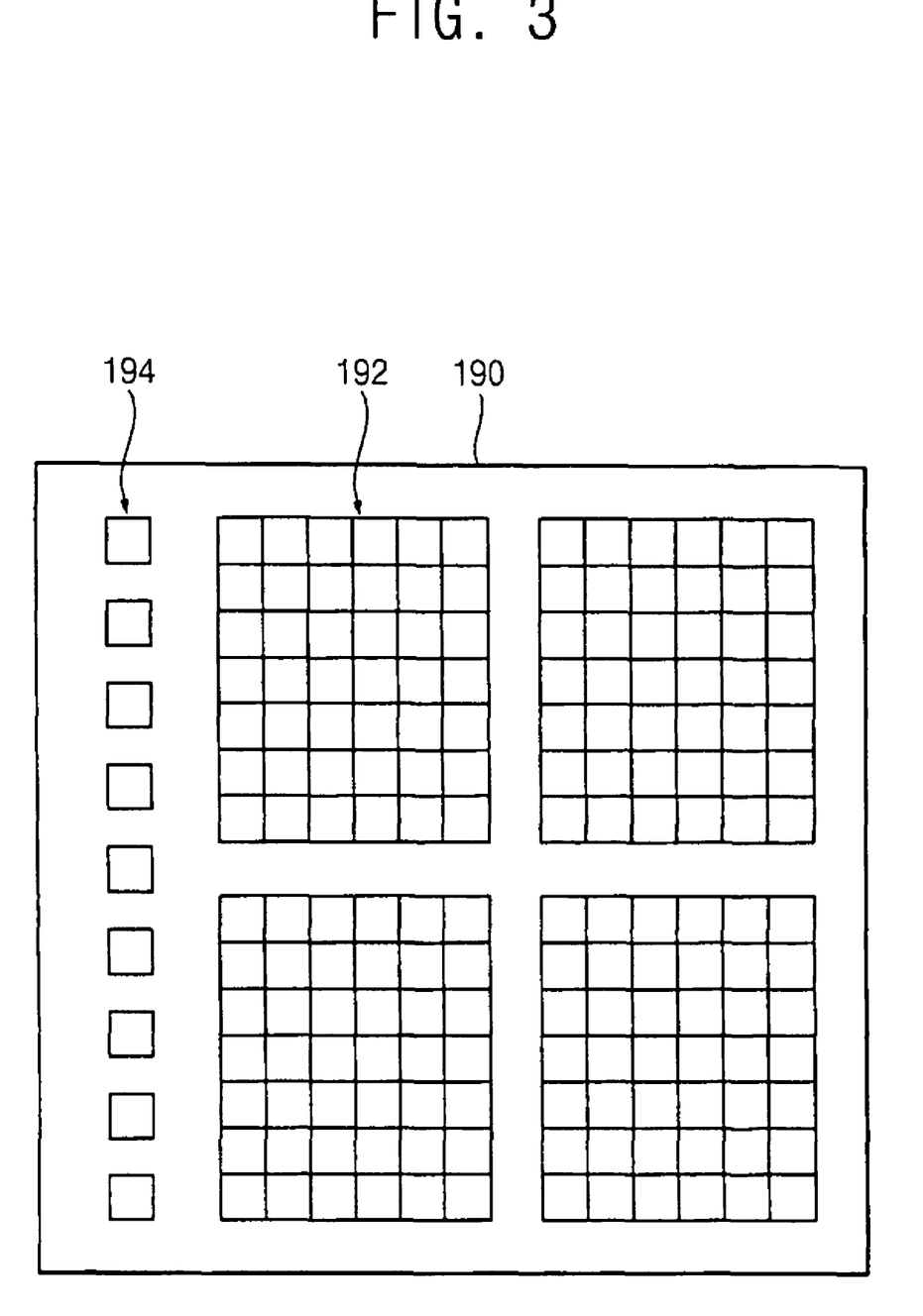
FIG. 3 is a plan view illustrating an object pattern and a substrate where a reference pattern is formed.

FIG. 2 is a flow chart illustrating a method of measuring a critical dimension of an object pattern according to some embodiments of the present invention. FIG. 3 is a plan view illustrating an object pattern and a substrate where a reference pattern is formed.

Referring to FIGS. 2 and 3, a reference pattern/patterns 194 may be initially formed on a side or peripheral portion of a substrate 190 in step S110. The substrate 190 may have a central portion on which an object pattern/patterns 192 is/are formed.

The reference pattern 194 and the object pattern 192 may be formed at the same time. Thus, the object pattern(s) 192 may be formed on the same lower layer as the reference pattern(s) 194. For example, the object pattern(s) 192 and the reference pattern(s) 194 may be formed on the substrate 190. Further, the object pattern(s) 192 and the reference pattern(s) 194 may have substantially a same thickness.

Alternatively, the object pattern(s) 192 may be formed before or after forming the reference pattern(s) 194. In this case, the object pattern(s) 192 may be formed using a same process used to form the reference pattern 194. Thus, the object pattern(s) 192 may be formed on the same lower layer as the reference pattern(s) 194. For example, the object pattern(s) 192 and the reference pattern(s) 194 may be formed on the substrate 190. Further, the object pattern(s) 192 and the reference pattern(s) 194 may have substantially a same thickness.

As illustrated in FIG. 3, the reference patterns 194 used to measure a critical dimension of the object pattern(s) 192 may have different reference critical dimensions. The reference pattern(s) 194 may be formed in each region having a same size. The regions may be spaced apart from one another by a predetermined distance. The reference critical dimensions may include the reference critical dimension, which is substantially the same as the critical dimension of the object pattern(s) 192, and a reference critical dimension(s), which is/are smaller and/or larger than the critical dimension of the object pattern(s) 192. As one example, if the critical dimension of the object pattern 192 is about 500 nm, sizes of the reference critical dimensions of the reference patterns 194 may be about 500 nm, which is substantially the same as the critical dimension of the object pattern 192; sizes of the reference critical dimensions of the reference patterns 194 may be about 495 nm, about 490 nm, about 485 nm, and/or about 480 nm, which are substantially less than about 500 nm; and/or sizes of the reference critical dimensions of the references patterns 194 may be about 505 nm, about 510 nm, about 515 nm, and/or about 520 nm, which are substantially greater than about 500 nm.

Further, differences in the reference critical dimensions of the reference patterns 194 may be relatively constant. A difference in the reference critical dimensions of the reference patterns 194 may vary depending on a required uniformity of the critical dimension of the object pattern 192. If a relatively high degree of uniformity of the critical dimension of the object pattern 192 is required, a difference in the reference critical dimensions may be relatively small. On the other hand, if a relatively low degree of uniformity of the critical dimension of the object pattern 192 is required, a difference in the reference critical dimensions may be relatively large. The substrate 190 may be a transparent photolithography mask substrate, a semiconductor substrate, etc.

Figure 4:
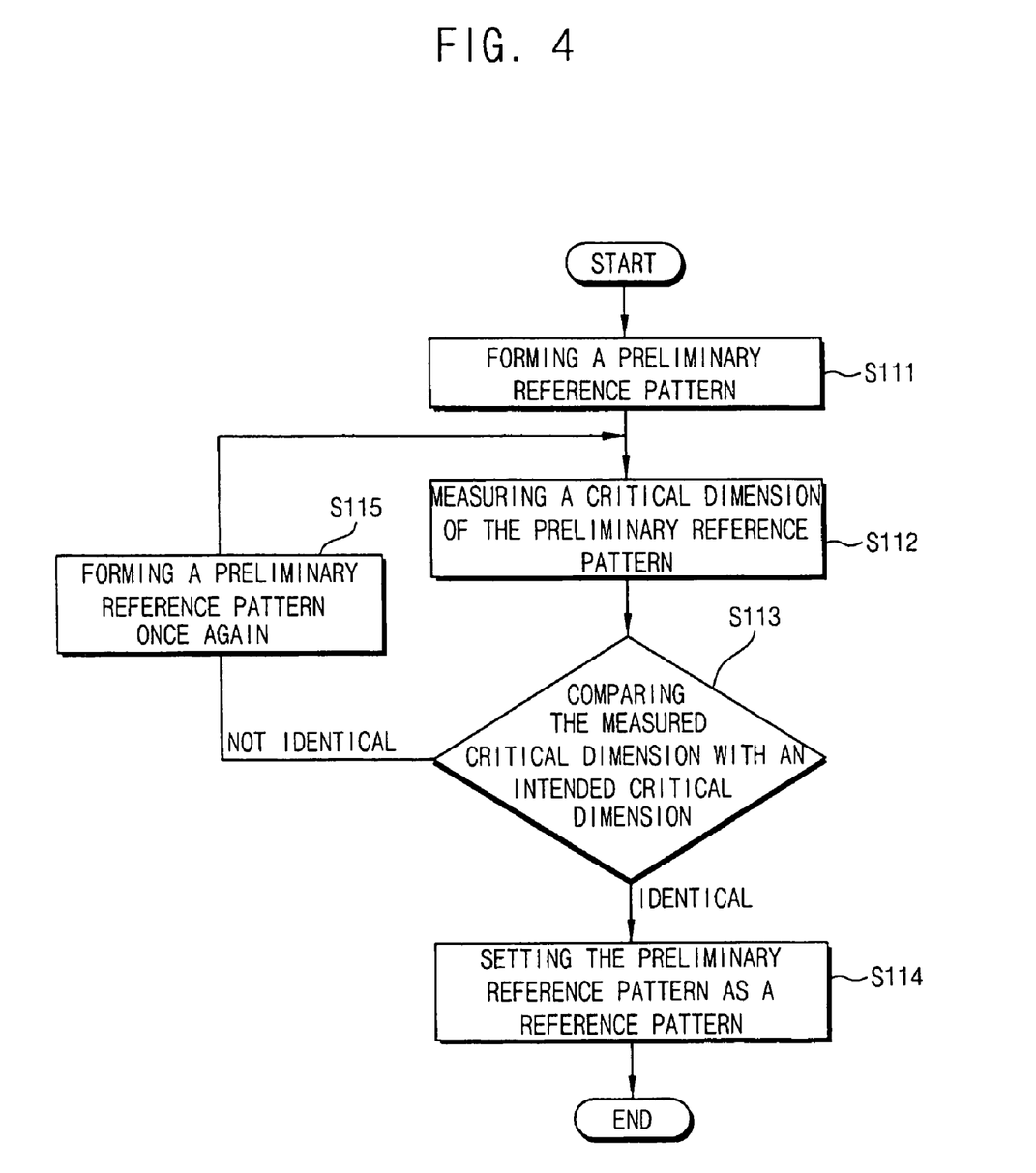
FIG. 4 is a flow chart illustrating methods of forming reference patterns of FIG. 2.

FIG. 4 is a flow chart illustrating a method of forming a reference pattern in FIG. 2. Referring to FIG. 4, to form the reference pattern 194, preliminary reference patterns (not illustrated) may be formed on the substrate 190 in step s111 such that the preliminary reference patterns may have different critical dimensions.

To verify whether or not the preliminary reference pattern has a critical dimension that is substantially identical to the intended critical dimensions of the respective preliminary reference patterns, critical dimensions of the preliminary reference patterns may be measured using the measuring unit 160 in step S112. More particularly, the measuring unit 160 may acquire an image of the preliminary reference pattern and the intended critical dimension(s) of the respective preliminary reference patterns may be the reference critical dimension(s). Critical dimensions of the preliminary reference pattern may then be measured from the image. Critical dimensions of the preliminary reference pattern may thus be effectively measured even though the preliminary reference pattern may have various shapes such as a bar shape. The measuring unit 160 may be a scanning electron microscope, etc.

The measured critical dimensions may then be compared with the intended critical dimensions of the respective preliminary reference patterns using the second comparing unit 170 in step S113. If the measured critical dimensions and the intended critical dimensions are substantially identical, the second setting unit 180 may set the preliminary reference pattern as the reference pattern in step S114.

If the measured critical dimensions and the intended critical dimensions are not substantially identical, the preliminary reference pattern may be removed and formed again in step S115. The preliminary reference pattern may also need to be removed and formed again when any of the measured critical dimension(s) is/are not substantially identical to the intended critical dimension(s).

Thereafter, critical dimensions of the subsequently formed preliminary reference pattern(s) may be measured and compared with the intended critical dimensions to set a reference pattern repeatedly in steps S112, S113, and S114.

Referring again to FIG. 2, the acquiring unit 120 illuminates the reference pattern 194 with light. The acquiring unit 120 then detects light that is reflected from the reference pattern 194 or that penetrates the reference pattern 194 after the reference pattern 194 is formed. Reference optic properties of the reference patterns in accordance with the critical dimensions may be acquired, for example, using an intensity of the detected light, etc. in step S120.

A portion of the substrate 190 where the object pattern(s) 192 is formed may be divided into a plurality of regions having substantially the same size as regions where the reference patterns 194 are formed. An optic property may be acquired from the region of the object pattern 192 using the acquiring unit 120 in the same manner as the reference property S130.

The reference optic property of the reference pattern and the optic property of the object pattern 192 may be, for example, reflectivity, transmittance, etc. The acquiring unit 120 may be a spectrophotometer, etc.

The optic properties acquired from each region of the object pattern 192 may be compared with the reference optic properties using the first comparing unit 130 in step S140.

If the reference optic property and the optic property obtained from one of the regions of the object pattern 192 are substantially identical, the first setting unit 140 sets the reference critical dimension of the reference pattern 194 having the reference optic property as a critical dimension of the region. The first setting unit 140 may set critical dimensions of the remaining regions in the same manner in step S150.

The object pattern(s) 192 may be formed on the same lower layer as the reference pattern(s) 194. For example, the object pattern(s) 192 and the reference pattern(s) 194 may be formed on the substrate 190. Here, the object pattern 192(s) and the reference pattern(s) 194 may have substantially a same thickness. Thus, if the optic property is substantially identical to the reference optic property, the critical dimension of the object pattern(s) 192 may be determined to be substantially the same as the reference critical dimension of the reference pattern 194.

After the critical dimensions of the entire regions of the object pattern(s) 192 are set, the displaying unit 150 may display the critical dimensions of the object pattern(s) 192 in step S160. Therefore, a uniformity of the object pattern(s) 192 may be effectively verified.

According to methods used to measure a critical dimension of an object pattern discussed above, critical dimensions of entire regions of the object pattern(s) 192 may be measured relatively rapidly and accurately by comparing the reference optic property of the object pattern(s) 194 having the reference critical dimension with the optic property of the object pattern(s) 192.

According to some embodiments of the present invention, reference patterns having different critical dimensions may be formed on a side or peripheral portion of a substrate having a central portion where object patterns are formed. A reference optic property of the reference pattern may be compared with an optic property of the object pattern to measure critical dimensions of the object patterns. Therefore, the critical dimensions of an entire pattern (including a plurality of object patterns) may be measured relatively rapidly and accurately.

The foregoing is illustrative of embodiments of the present invention and is not to be construed as limiting thereof. Although particular embodiments of the present invention have been described, those skilled in the art will readily appreciate that many modifications are possible in the embodiments without materially departing from the novel teachings and advantages of this invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of measuring a critical dimension, the method comprising:
    forming an object pattern on a substrate;
    forming a plurality of reference patterns on the substrate wherein each of the plurality of reference patterns has a different critical dimension;
    measuring an optical property of each of the plurality of reference patterns to provide a respective measured optical property for each of the reference patterns;
    measuring an optical property of the object pattern to provide a measured optical property of the object pattern;
    comparing the measured optical property of the object pattern with the measured optical properties of the reference patterns; and
    determining a critical dimension of the object pattern as being the same as the critical dimension of the reference pattern having the measured optical property that is closest to the measured optical property of the object pattern.

2. A method according to claim 1 wherein forming the plurality of reference patterns comprises,
    forming a plurality of preliminary reference patterns wherein each of the plurality of preliminary reference patterns has a different critical dimension,
    measuring a critical dimension of each of the plurality of preliminary reference patterns to provide a respective measured critical dimension for each of the preliminary reference patterns,
    comparing the measured critical dimensions of the respective preliminary reference patterns with intended critical dimensions of the respective preliminary reference patterns, and if the measured critical dimensions are substantially the same as the intended critical dimensions, maintaining the plurality of preliminary reference patterns as the plurality of reference patterns.

3. A method according to claim 2 wherein forming the plurality of reference patterns further comprises, if the measured critical dimensions are substantially different than the intended critical dimensions, removing the first plurality of preliminary reference patterns and forming a second plurality of preliminary reference patterns.

4. A method according to claim 2 wherein measuring a critical dimension of each of the plurality of preliminary reference patterns comprises obtaining an image of each of the plurality of preliminary reference patterns using a scanning electron microscope.

5. A method according to claim 1 further comprising:
providing an indication of the critical dimension of the object pattern on a display.

6. A method according to claim 1 wherein measuring an optical property of each of the plurality of reference patterns and measuring an optical property of the object pattern comprises measuring the optical properties using a spectrophotometer.

7. A method according to claim 1 wherein measuring the optical properties of each of the reference patterns comprises measuring the optical property over a respective region of each of the reference patterns having the defined area, and wherein measuring the optical property of the object pattern comprises measuring the optical property over a region of the object pattern having a defined area.

8. A method according to claim 1 wherein a first one of the reference patterns has a first critical dimension less than the critical dimension of the object pattern and wherein a second one of the reference patterns has a second critical dimension greater than the critical dimension of the object pattern.

9. A method according to claim 1 wherein a first one of the reference patterns has a first critical dimension, wherein a second one of the reference patterns has a second critical dimension, wherein a third one of the reference patterns has a third critical dimension, wherein the second critical dimension is greater than the first critical dimension, wherein the third critical dimension is greater than the second critical dimension, and wherein a difference between the first and second critical dimensions is approximately the same as a difference between the second and third critical dimensions.

10. A method according to claim 1 wherein measuring the optical property of each of the plurality of reference patterns comprises measuring a reflectivity of each of the plurality of reference patterns, and wherein measuring the optical property of the object pattern comprises measuring a reflectivity of the object pattern.

11. A method according to claim 1 wherein measuring the optical property of each of the plurality of reference patterns comprises measuring a transmittance of each of the plurality of reference patterns, and wherein measuring the optical property of the object pattern comprises measuring a transmittance of the object pattern.

12. A method according to claim 1 wherein the substrate comprises a semiconductor substrate or a photolithography mask substrate.

* * * * *